(12) United States Patent
Wen et al.

(10) Patent No.: US 9,035,389 B2
(45) Date of Patent: May 19, 2015

(54) LAYOUT SCHEMES FOR CASCADE MOS TRANSISTORS

(71) Applicant: Taiwan Semiconductor Manufacturing Company, Ltd., Hsin-Chu (TW)

(72) Inventors: Chin-Hua Wen, Toufen Township (TW); Wen-Shen Chou, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 223 days.

(21) Appl. No.: 13/657,389

(22) Filed: Oct. 22, 2012

(65) Prior Publication Data
US 2014/0110787 A1    Apr. 24, 2014

(51) Int. Cl.
*H01L 21/70* (2006.01)
*H01L 27/12* (2006.01)
*H01L 27/088* (2006.01)
*H01L 29/06* (2006.01)
*H01L 23/528* (2006.01)

(52) U.S. Cl.
CPC .......... *H01L 27/1203* (2013.01); *H01L 27/088* (2013.01); *H01L 23/5286* (2013.01); *H01L 29/0692* (2013.01); *H01L 2924/0002* (2013.01)

(58) Field of Classification Search
USPC ............................................ 257/368, E27.06
See application file for complete search history.

(56) References Cited

U.S. PATENT DOCUMENTS

| 5,565,375 A * | 10/1996 | Hiser et al. ..................... 438/213 |
| 2003/0001171 A1* | 1/2003 | Banno et al. .................. 257/207 |
| 2007/0069347 A1* | 3/2007 | Lin et al. ....................... 257/673 |

FOREIGN PATENT DOCUMENTS

TW       I308785       10/2006

* cited by examiner

*Primary Examiner* — Brett Feeney
*Assistant Examiner* — Jamie C Niesz
(74) *Attorney, Agent, or Firm* — Slater & Matsil, L.L.P.

(57) ABSTRACT

A device includes a first and a second MOS device cascaded with the first MOS device to form a first finger. A drain of the first MOS device and a source of the second MOS device are joined to form a first common source/drain region. The device further includes a third and a fourth MOS device cascaded with the third MOS device to form a second finger. A drain of the third MOS device and a source of the fourth MOS device are joined to form a second common source/drain region. The first and the second common source/drain regions are electrically disconnected from each other. Sources of the first and the third MOS devices are interconnected. Drains of the second and the fourth MOS devices are interconnected. Gates of the first and the third MOS devices are interconnected. Gates of the second and the fourth MOS devices are interconnected.

19 Claims, 7 Drawing Sheets

LAYOUT SCHEMES FOR CASCADE MOS TRANSISTORS

BACKGROUND

Integrated circuits often include cascade Metal-Oxide-Semiconductor (MOS) devices. The cascade MOS devices may be used in power circuits. In some circuits, each of the MOS devices (referred to as large MOS devices hereinafter) is implemented by connecting a plurality of MOS devices (referred to as small MOS devices hereinafter) in parallel, which means that sources of all of the small MOS devices are interconnected, gates of all of the small MOS devices are interconnected, and drains of all of the small MOS devices are interconnected.

For example, when there are two large MOS devices cascaded, the source of the first large MOS device is connected to the drain of the second large device. The first large MOS device is implanted by connecting a first plurality of small MOS devices in parallel. The second large MOS device is implanted by connecting a second plurality of small MOS devices in parallel. The sources of the first plurality of small MOS devices are thus connected to the drains of the second plurality of small MOS devices, for example, through metal lines, vias, and/or contact plugs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A formation scheme of cascade Metal-Oxide-Semiconductor (MOS) devices is provided in accordance with various exemplary embodiments. The variations of the embodiments are discussed. Throughout the various views and illustrative embodiments, like reference numbers are used to designate like elements.

Figure 1:
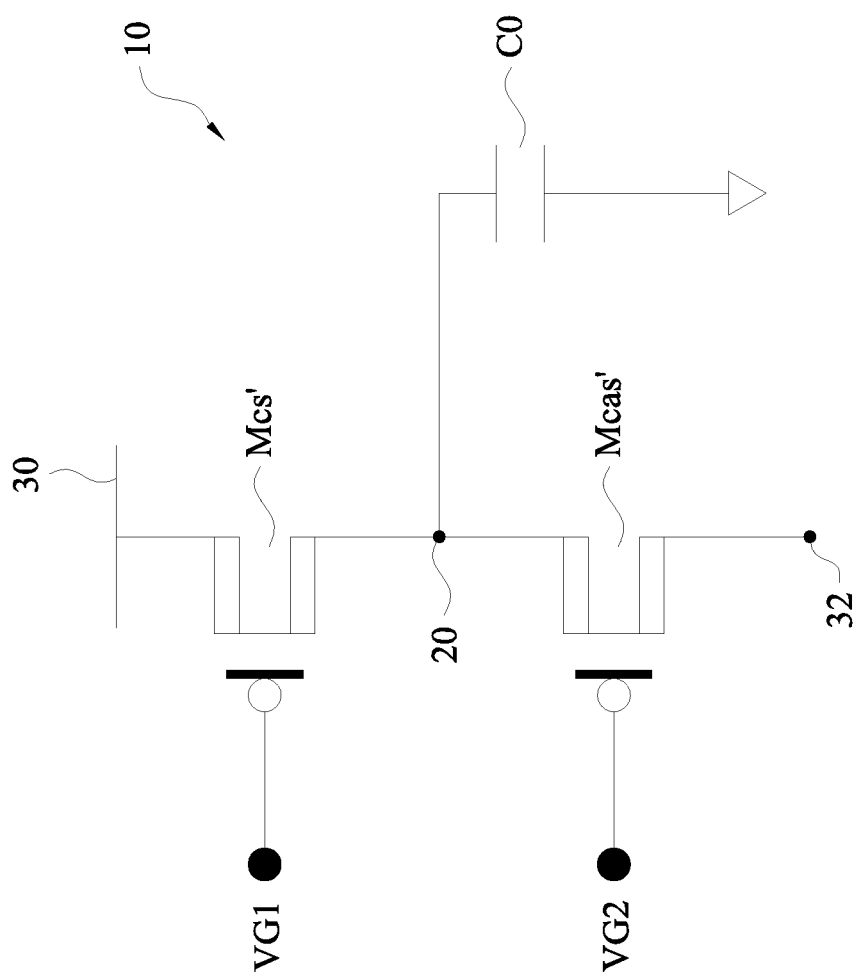
FIG. 1 illustrates an equivalent circuit diagram of two cascade P-type Metal-Oxide-Semiconductor (PMOS) devices, wherein a source of one PMOS device is connected to a drain of the other PMOS device.

FIG. 1 illustrates an equivalent circuit diagram of cascade MOS structure 10, which includes MOS device Mcs' cascaded with device Mcas'. In the illustrative embodiments, MOS devices Mcs' and Mcas' are P-type MOS (PMOS) devices. The drain of MOS device Mcs' is connected to, and may be shorted to, the source of MOS device Mcas'. The drain of MOS device Mcs' and the source of MOS device Mcas' are in combination denoted as source/drain 20. The source of MOS device Mcs' is denoted as source/drain 30, and the drain of MOS device Mcas' is denoted as source/drain 32. Throughout the description, the term "source/drain" represents either a source or a drain, depending on the role of the respective region of the MOS device. Throughout the description, source regions, drain regions, and gates of MOS devices are alternatively referred to as nodes. The gates of MOS devices Mcs' and Mcas' may be disconnected from each other, and may be connected to voltages VG1 and VG2, respectively. The parasitic capacitance of source/drain 20 is illustrated as capacitor C0.

Figure 2:
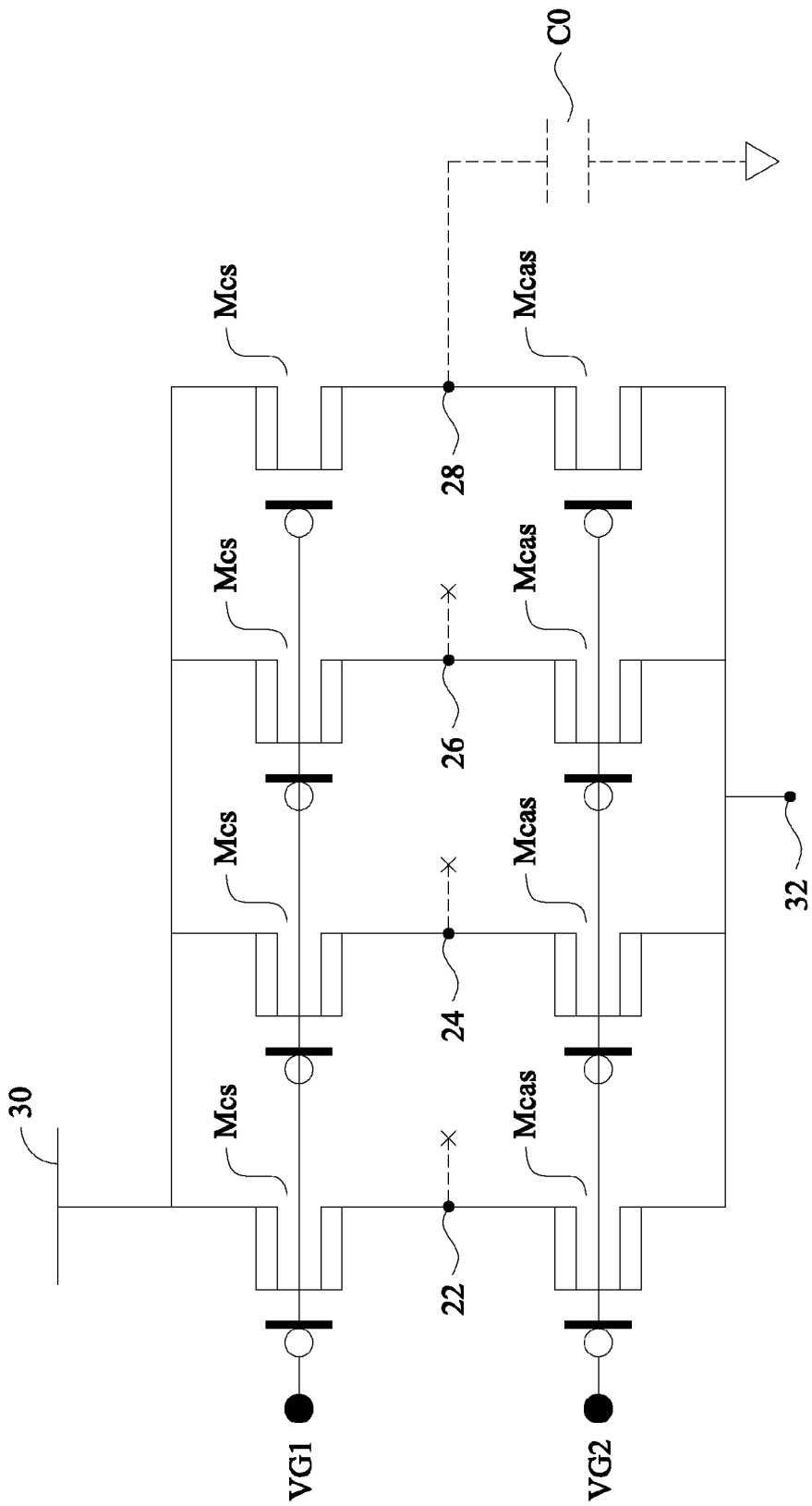
FIG. 2 illustrates the implementation of the two cascade PMOS devices in FIG. 1 in accordance with embodiments, wherein each of the cascade PMOS devices is implemented using four PMOS devices connected in parallel.

FIG. 2 illustrates an exemplary implementation of the circuit shown in FIG. 1. In the illustrated embodiments, each of MOS devices Mcs' and Mcas' is implanted using a plurality of parallel connected MOS devices, which are denoted as MOS devices Mcs and Mcas, respectively. For example, MOS device Mcs' is implemented using four MOS devices Mcs, wherein the sources of MOS devices Mcs are interconnected (shorted, for example), and are shown as connected to node 30. Although FIG. 2 illustrates four MOS devices Mcs connected in parallel, in alternative embodiments, MOS device Mcs' may be implemented by connecting two, six, or any other even number of MOS device Mcs in parallel. The gates of MOS devices Mcs are interconnected, and are connected to voltage VG1. The drains of MOS devices Mcs, however, are disconnected from each other, as symbolized by the "x" signs. The plurality of MOS devices Mcs in combination functions as MOS device Mcs' in FIG. 1. For example, to make the combination of MOS devices Mcs to have same performance as MOS device Mcs', MOS devices Mcs may have the same gate length as MOS device Mcs', and the sum of the gate widths of all parallel connected MOS devices Mcs is equal to the gate width of MOS device Mcs'.

MOS device Mcas' in FIG. 1 may also be implemented using a plurality of (such as two, four, six, or other even numbers) MOS devices Mcas connected in parallel, wherein the drains of MOS devices Mcas are interconnected (shorted, for example). The gates of MOS devices Mcas are interconnected, and are connected to voltage VG2. The sources of MOS devices Mcas, however, are disconnected from each other, as symbolized by the "x" signs. The plurality of MOS devices Mcas in combination functions as MOS device Mcas' in FIG. 1. For example, in order to have the same performance as MOS device Mcas', MOS devices Mcas may have the same gate length as MOS device Mcas', and the sum of the gate widths of all parallel connected MOS devices Mcas is equal to the gate width of MOS device Mcas'.

Figure 6:
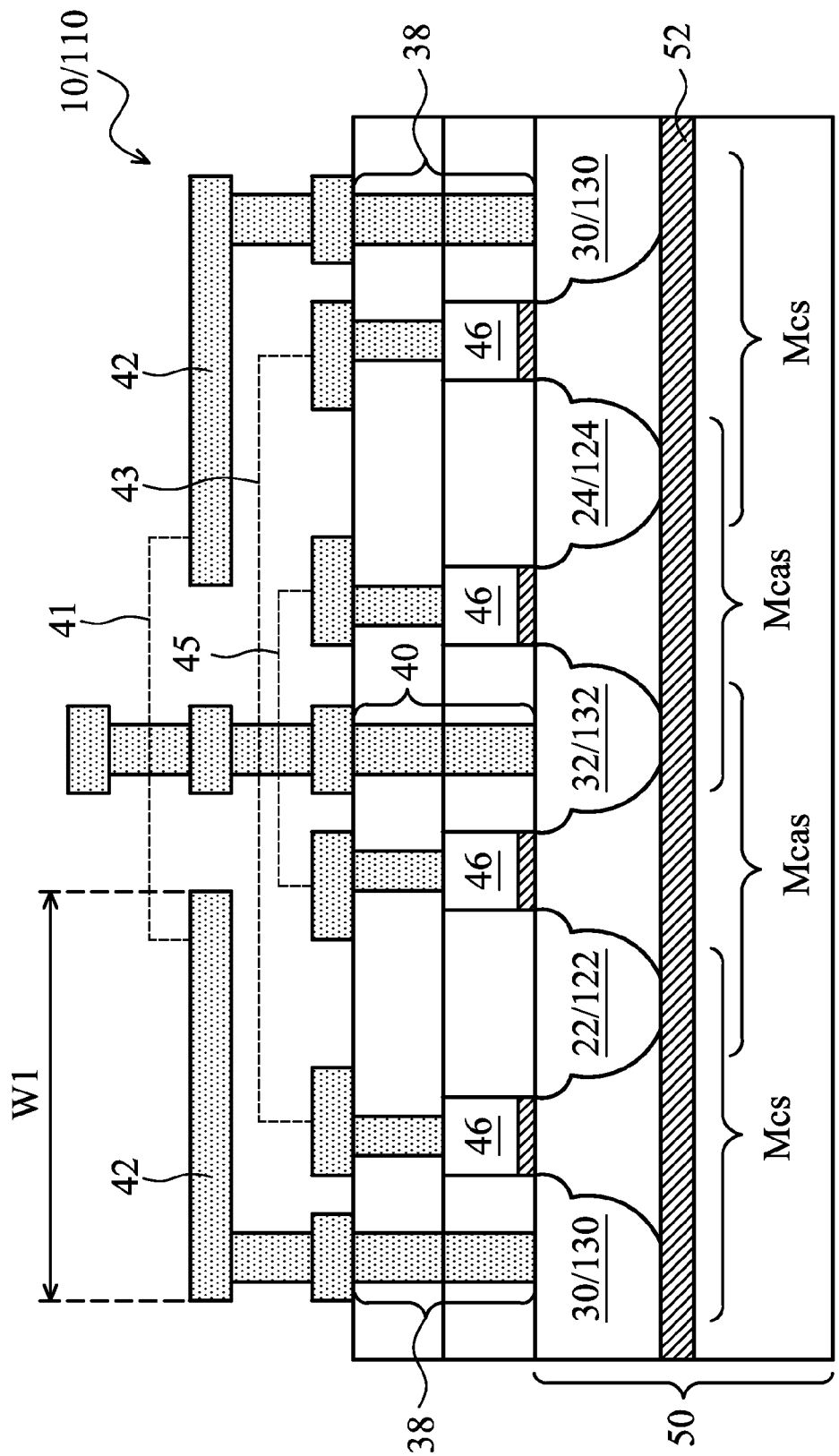
FIG. 6 illustrates a cross-sectional view of the structure shown in FIG. 5 in accordance with exemplary embodiments.
Figure 7:
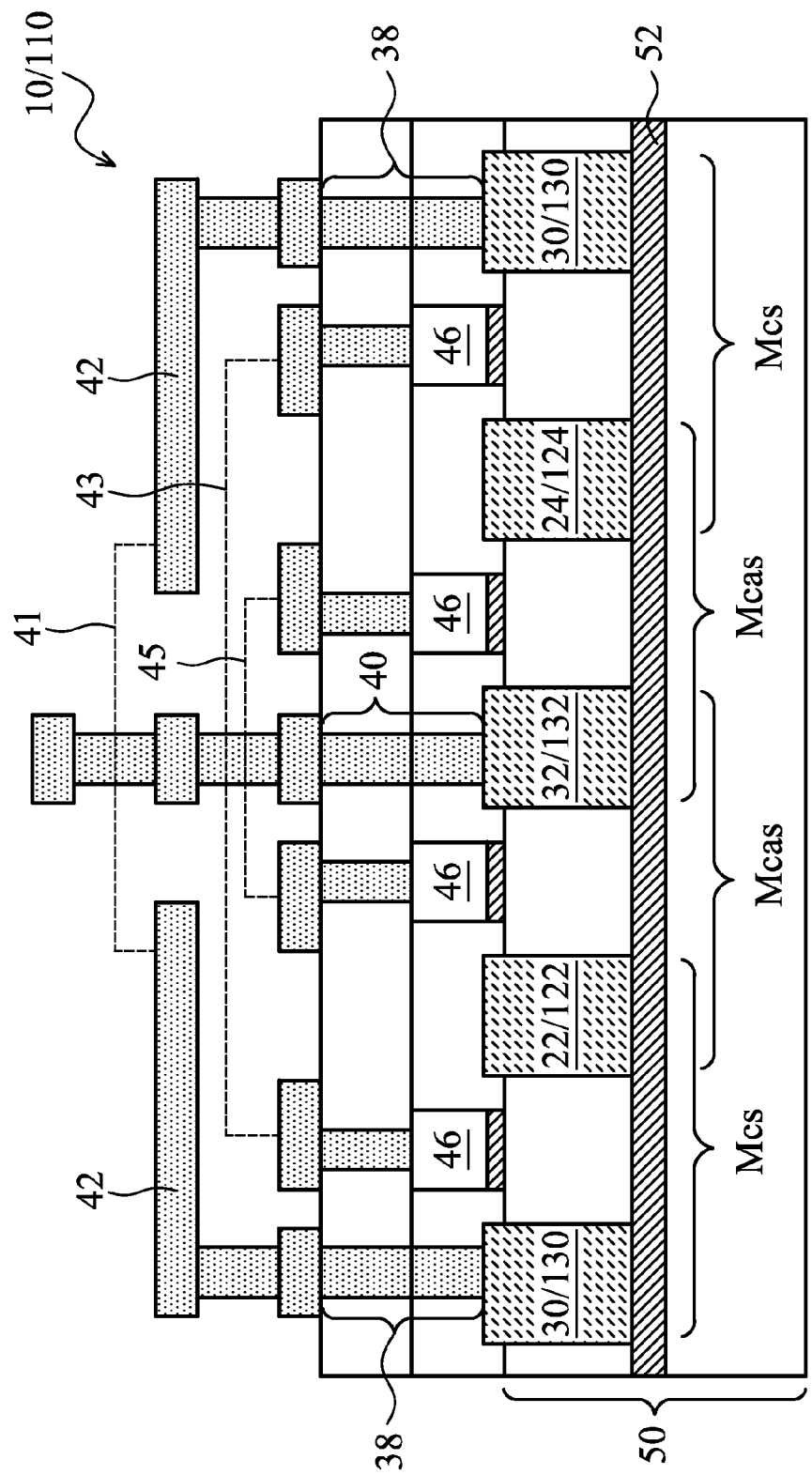
FIG. 7 illustrates a cross-sectional view of the structure shown in FIG. 5 in accordance with alternative exemplary embodiments, in which raised source and drain regions are adopted.

Throughout the description, a pair of cascade MOS devices Mcs and Mcas in combination is referred to as a finger of the resulting cascade MOS structure 10, wherein the drain of MOS device Mcs is connected to the source of MOS device Mcas in the same finger. Accordingly, in FIG. 2, there are four fingers. Furthermore, the drain of MOS device Mcs and the source of MOS device Mcas may join with each other to form a common source/drain region, as illustrated in FIGS. 6 and 7.

The gates of MOS devices Mcs are interconnected, and the gates of MOS devices Mcas are interconnected. Accordingly, MOS devices Mcs form a current minor comprising a plurality of (such as four) current paths, and MOS devices Mcas form a current minor comprising a plurality of current paths. Nodes 22, 24, 26, and 28, which are the drains of MOS devices Mcs and the sources of MOS devices Mcas, may have a same voltage, although they are disconnected from each other. Accordingly, source/drain regions 22, 24, 26, and 28 are referred to as being virtually connected to each other.

Figure 3:
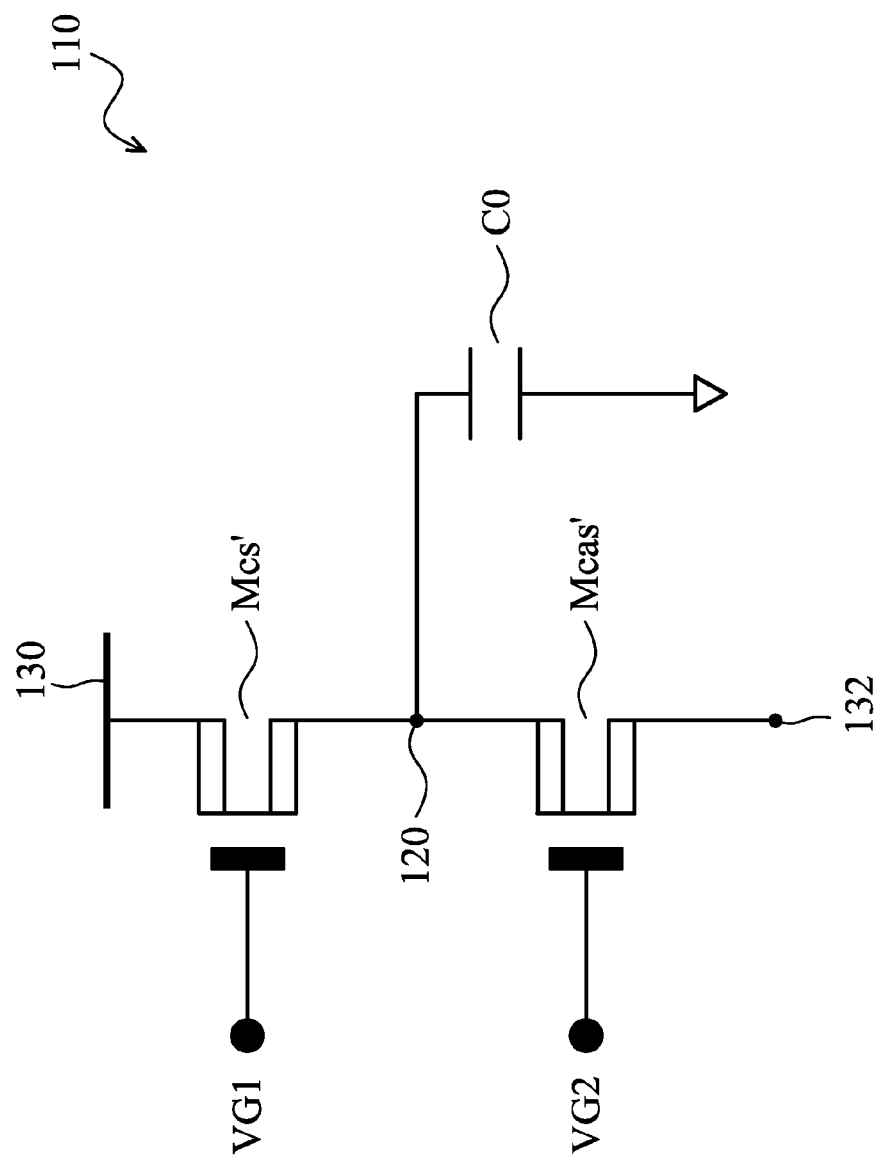
FIG. 3 illustrates an equivalent circuit diagram of two cascade N-type Metal-Oxide-Semiconductor (NMOS) devices, wherein a source of one NMOS device is connected to a drain of the other NMOS device.

FIG. 3 illustrate a circuit diagram of cascade MOS structure 110 including cascade MOS devices Mcs' and Mcas', which are N-type MOS (NMOS) devices in these embodiments. The drain of MOS device Mcas' is denoted as source/drain region 130, and the source of MOS device Mcas' is denoted as source/drain region 132.

Figure 4:
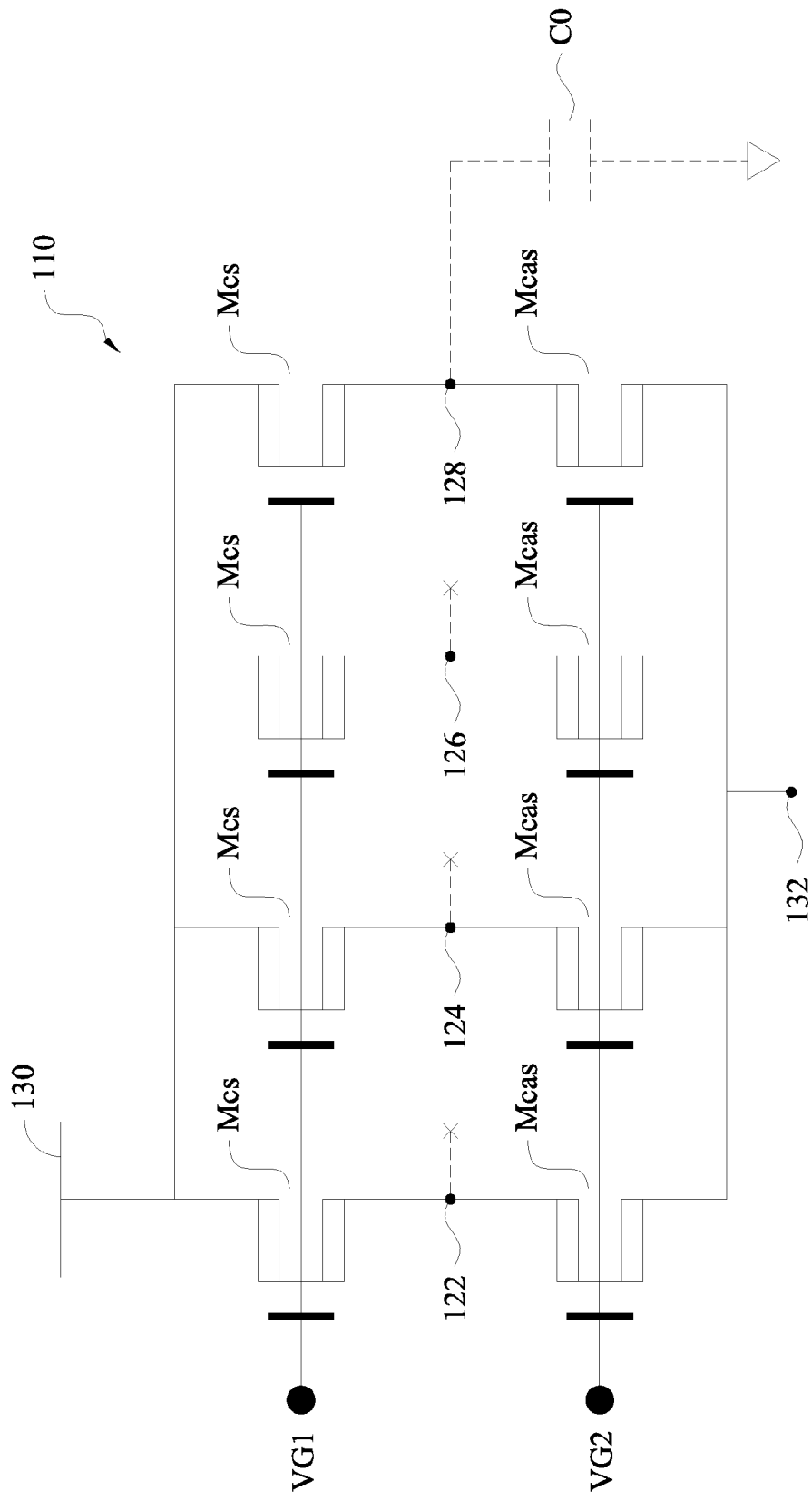
FIG. 4 illustrates the implementation of the two cascade NMOS devices in FIG. 3 in accordance with embodiments, wherein each of the cascade NMOS devices is implemented using four NMOS devices connected in parallel.

FIG. 4 illustrates an exemplary implementation of the circuit in FIG. 3, wherein a plurality of (such as four) parallel connected MOS devices Mcs in combination functions as MOS device Mcs' in FIG. 3, and a plurality of (such as four) parallel connected MOS devices Mcas in combination functions as MOS device Mcas' in FIG. 3. In these embodiments, source/drain regions 122, 124, 126, and 128 will also have the same voltage, and hence are virtually connected, although they are electrically disconnected from each other.

Figure 5:
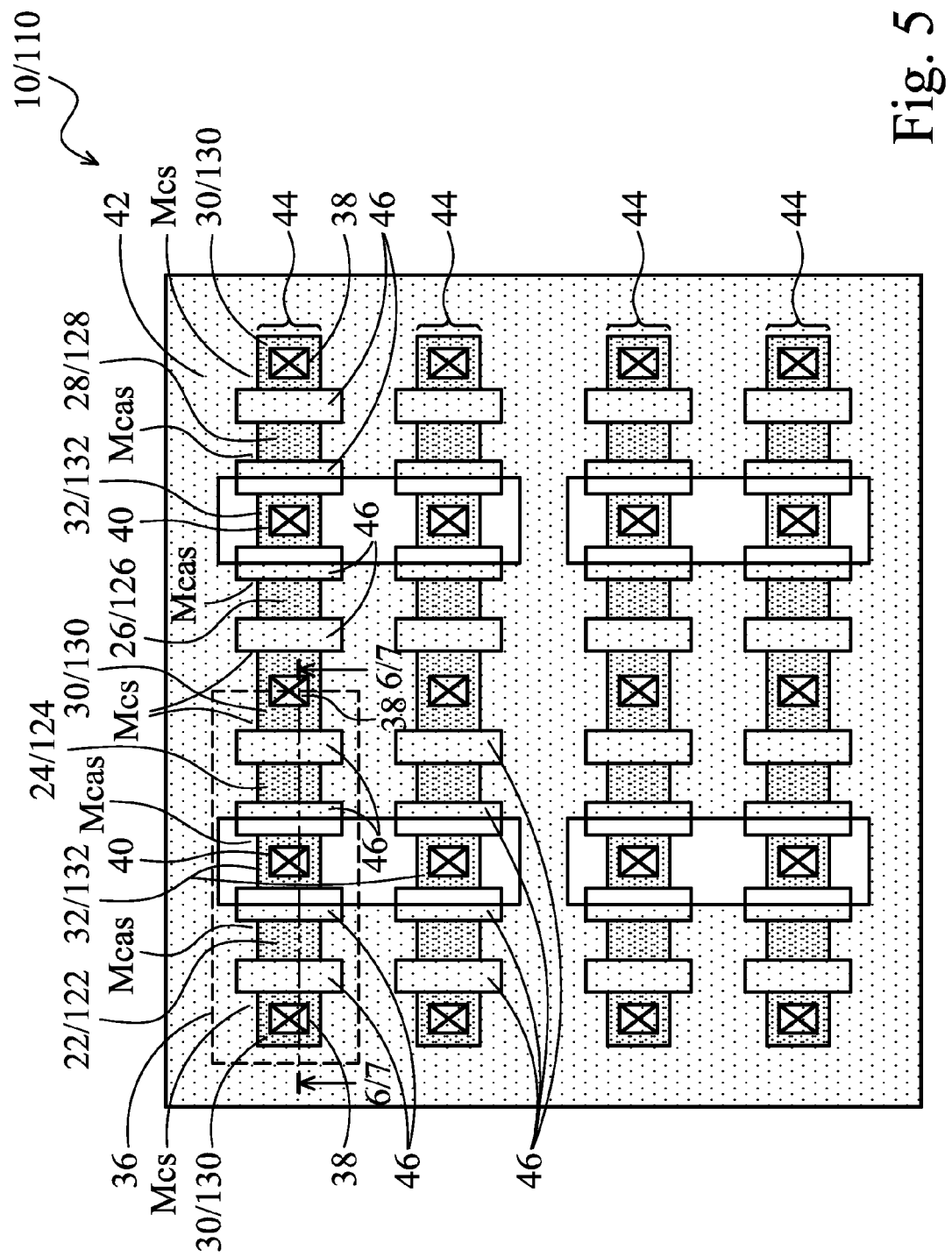
FIG. 5 illustrates a top view (or a layout) of the devices illustrated in FIGS. 1 through 4 in accordance with embodiments.

FIG. 5 illustrates a top view (which may also represent a layout) of cascade MOS structure 10 or 110 (denoted as "10/110"). Cascade MOS structure 10/110 includes MOS devices Mcs and Mcas, which may be PMOS devices as in FIGS. 1 and 2, or NMOS devices as in FIGS. 3 and 4. Accordingly, the reference notations are marked for both PMOS devices and NMOS devices, with a "/" sign separating PMOS notations from NMOS notations. For example, reference notation "30/130" indicates the respective source/drain region may be source/drain region 30 if the respective structure in FIG. 5 includes cascaded PMOS devices, or may be source/drain region 130 if the respective structure in FIG. 5 includes cascaded NMOS devices.

Active regions 44 are illustrated as long active region strips that are parallel to each other. A plurality of gate electrodes 46 are formed over each of active region strips 44 to form a plurality of MOS devices Mcs and Mcas. In the illustrative embodiments, MOS devices Mcs and Mcas are disposed as four rows that are identical to each other. In the illustrated embodiments, there are four MOS devices Mcs in a row, which are connected in parallel. There are also four MOS devices Mcas in a row, which are also connected in parallel. Accordingly, in the structure in FIG. 5, since there are four rows of MOS devices, there are 16 MOS devices Mcs connected in parallel, and there are 16 MOS devices Mcs connected in parallel. A unit cascade device cell is illustrated as unit cell 36, which includes two MOS devices Mcs and two MOS devices Mcas that form two fingers (FIGS. 2 and 4). As shown in FIG. 5, the size of the cascade MOS structure 10/110 may be expanded by reproducing and parallel connecting unit cells 36.

As shown in FIG. 5, source/drain regions 30/130 are connected to contact plugs, which are marked as 38. Source/drain regions 32/132 are also connected to contact plugs, which are marked as 40. There is no contact plugs, however, overlying and connected to source/drain regions 22/122. On the other hand, source/drain regions 22/122, however, as discussed for FIGS. 2 and 4, are virtually connected since they always have the same voltage level. Accordingly, not interconnecting source/drain regions 22/122 and 24/124 has the same effect as interconnecting them.

Since there are no contact plugs, metal lines, and vias that are overlying and connected to source/drain regions 22/122, metal power bus 42 may occupy the chip area that is otherwise used by the connection to source/drain regions 22/122. As a result, in FIG. 5, metal power bus 42 expands overlying source/drain regions 22/122. Power bus 42 may thus be designed as a wide bus that expands to overlap more than one source and drain regions. For example, power bus 42 may overlap entireties of sourced/drain regions 24/124, 26/126, and the source/drain region 30/130 therebetween. The increase in the width of power bus 42 results in the desirable reduction in the current density flowing through power bus 42. In conventional structures, however, source/drain regions 22/122, 24/124, 26/126, and 28/128 need to be connected to overlying contact plugs, metal lines, and/or vias, and hence power bus 42 cannot expand overlying source/drain regions 22/122, 24/124, 26/126, and 28/128.

Referring to FIG. 6, a cross-sectional view of the structure shown in FIG. 5 is illustrated, wherein the cross-sectional view is obtained from the plane crossing line 6/7-6/7 in FIG. 5. In FIG. 6, MOS devices Mcs and Mcas are formed at the top surface of substrate 50, which may be a bulk semiconductor substrate, or a Semiconductor-On-Insulator (SOI) substrate comprising buried oxide layer 52 therein. Source/drain regions 30/130, which are sources of PMOS devices Mcs (FIG. 2) or drains of NMOS devices Mcs (FIG. 4), are connected to overlying contact plugs 38. Source/drain region 32/132, which is the drains of PMOS devices Mcas (FIG. 2) or sources of NMOS devices Mcas (FIG. 4), are connected to overlying contact plugs 40.

In the illustrated embodiments, source/drain regions 32/132 of neighboring MOS devices Mcas are interconnected as a common source/drain region. Source/drain regions 22/122, however, do not have any overlying contact plugs connected to them. Similarly, source/drain regions 24/124 do not have any overlying contact plugs connected to them. Power bus 42 may overlap source/drain regions 22/122 and/or source/drain regions 24/124. Accordingly, the width W1 of power bus 42 is increased. Power bus 42 may thus expand to overlap regions 22/122 and/or 24/124, and may further overlap gate electrodes 46 of MOS devices Mcs and Mcas in some embodiments.

FIG. 6 also illustrates electrical connection 41 for interconnecting power bus 42. In the exemplary embodiments in FIG. 5, power bus 42 forms a continuous region, which functions as the electrical connection 41 in FIG. 6. Electrical connection 43 interconnects gate electrodes 46 of MOS devices Mcs. Electrical connection 45 interconnects gate electrodes 46 of MOS devices Mcas. Electrical connections 43 and 45 may include metal lines and metal vias.

FIG. 7 illustrates the cross-sectional view of cascade structure 10/110 in accordance with alternative embodiments. Unless specified otherwise, the details of the components in these embodiments are essentially the same as the like components, which are denoted by like reference notations in the embodiments shown in FIG. 6. The structure shown in FIG. 7 is essentially the same as the structure in FIG. 6, except that source and drain regions 30/130, 32/132, 22/122, and 24/124 are raised source or drain regions. The raised source or drain regions may be formed, for example, by etching substrate 50 to form trenches, and then epitaxially growing the raised source and drain regions in the trenches, until the grown source and drain regions comprise portions higher than the original surface of substrate 50.

In the embodiments, by forming cascade MOS devices including a plurality of fingers, and making the common source/drain regions of the plurality of fingers virtually connected, rather than connected through metal connections, the common source/drain regions do not need to have metal lines and contact plugs overlying and connect to them. Accordingly, the chip area that is otherwise occupied by the metal lines are released, and power bus 42 (FIG. 5) may be wider. This results in the reduction in the current density in power bus 42, and the reduction in the electro-migration in power bus 42. Furthermore, with the elimination of the metal lines and contact plugs for connecting to the common source/drain regions of the fingers, the parasitic capacitance (C0 in FIGS. 1 through 4) caused by the metal lines and contact plugs are eliminated, and hence the overall parasitic capacitance C0 of the common source/drain regions is reduced. The frequency response of the cascade MOS structure may thus expand to higher frequencies.

In accordance with embodiments, a device includes a first MOS device, and a second MOS device cascaded with the first MOS device to form a first finger. A drain of the first MOS device and a source of the second MOS device are joined to form a first common source/drain region. The device further includes a third MOS device, and a fourth MOS device cascaded with the third MOS device to form a second finger. A drain of the third MOS device and a source of the fourth MOS device are joined to form a second common source/drain region. The first and the second common source/drain regions are electrically disconnected from each other. Sources of the first and the third MOS devices are interconnected. Drains of the second and the fourth MOS devices are interconnected. Gates of the first and the third MOS devices are interconnected. Gates of the second and the fourth MOS devices are interconnected.

In accordance with other embodiments, a device includes a semiconductor substrate comprising an active region strip. A first, a second, a third, and a fourth gate electrodes are parallel to each other, cross the active region strip, and form a first, a second, a third, and a fourth MOS device that are of a same conductivity type with the active region strip. A first common source/drain region is disposed between the first and the second gate electrodes, wherein the first common source/drain region is shared by the first and the second MOS devices. A second common source/drain region is disposed between the second and the third gate electrodes, wherein the second common source/drain region is shared by the second and the third MOS devices. A third common source/drain region is disposed between the third and the fourth gate electrodes, wherein the third common source/drain region is shared by the third and the fourth MOS devices. A first electrical connection interconnects the first gate electrode and the fourth gate electrode. A second electrical connection interconnects the second gate electrode and the third gate electrode. A first contact plug is overlying and connected to the second common source/drain region, wherein no contact plug is over and connected to the first common source/drain region.

In accordance with yet other embodiments, a device includes a plurality of fingers identical to each other. Each of the fingers includes a first and a second MOS device. The first MOS device includes a first gate, wherein the first gates of the first MOS devices in the plurality of fingers are interconnected, a first source/drain region, wherein the first source/drain regions of the first MOS devices in the plurality of fingers are interconnected, and a second source/drain region. The second MOS device is cascaded with the first MOS device. The first and the second MOS devices have a same conductivity type. The second MOS device includes a second gate, wherein the second gates of the second MOS devices in the plurality of fingers are interconnected, a third source/drain region forming a common source/drain region with the second source/drain region, wherein the common source/drain regions in the plurality of fingers are disconnected from each other, and a fourth source/drain region, wherein the fourth source/drain regions of the second MOS devices in the plurality of fingers are interconnected.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first Metal-Oxide-Semiconductor (MOS) device;
a second MOS device cascaded with the first MOS device to form a first finger, wherein a drain of the first MOS device and a source of the second MOS device are joined to form a first common source/drain region;
a third MOS device;
a fourth MOS device cascaded with the third MOS device to form a second finger, wherein a drain of the third MOS device and a source of the fourth MOS device are joined to form a second common source/drain region, wherein the first and the second common source/drain regions are electrically disconnected from each other, and wherein:
  sources of the first and the third MOS devices are interconnected;
  drains of the second and the fourth MOS devices are interconnected;
  gates of the first and the third MOS devices are interconnected; and
  gates of the second and the fourth MOS devices are interconnected; and
a power bus in a metal layer and forming a continuous metal overlapping both the source of the first MOS device and the first common source/drain region, wherein the source of the first MOS device is connected to the power bus, and the first common source/drain region and the second common source/drain region are electrically disconnected from the power bus.

2. The device of claim 1, wherein the first MOS device, the second MOS device, the third MOS device, and the fourth MOS device have a same conductivity type.

3. The device of claim 1, wherein no contact plugs are formed over and connected to the first common source/drain region and the second common source/drain region.

4. The device of claim 1 further comprising a third finger and a fourth finger identical to the first and the second fingers, wherein the first, the second, the third, and the fourth fingers are connected in parallel.

5. The device of claim 4, wherein the first and the second fingers form a first row comprising a first active region strip, and the third and the fourth fingers form a second row comprising a second active region strip parallel to the first active region strip.

6. The device of claim 4, wherein the first, the second, the third, and the fourth fingers form a same row of MOS devices sharing a same active region strip.

7. The device of claim 1, wherein the first, the second, the third, and the fourth MOS devices are of a same conductivity type.

8. The device of claim 7, wherein the first, the second, the third, and the fourth MOS devices are PMOS devices.

9. The device of claim 7, wherein the first, the second, the third, and the fourth MOS devices are NMOS devices.

10. A device comprising:
a semiconductor substrate comprising an active region strip;
a first, a second, a third, and a fourth gate electrode parallel to each other, crossing the active region strip, and forming a first, a second, a third, and a fourth Metal-Oxide-Semiconductor (MOS) device that are of a same conductivity type with the active region strip;
a first common source/drain region between the first and the second gate electrodes, wherein the first common source/drain region is shared by the first and the second MOS devices;
a second common source/drain region between the second and the third gate electrodes, wherein the second common source/drain region is shared by the second and the third MOS devices;
a third common source/drain region between the third and the fourth gate electrodes, wherein the third common source/drain region is shared by the third and the fourth MOS devices;
a first electrical connection interconnecting the first gate electrode and the fourth gate electrode;
a second electrical connection interconnecting the second gate electrode and the third gate electrode;
a first contact plug over and connected to the second common source/drain region, wherein no contact plug is over and connected to the first common source/drain region; and
a metal power bus over and electrically coupled to a source/drain region of the first MOS device, with the source/drain region of the first MOS device and the first common source/drain region being on opposite sides of the first gate electrode, wherein the metal power bus overlaps the source/drain region, the first gate electrode, and the first common source/drain region.

11. The device of claim 10, wherein no contact plug is over and connected to the third common source/drain region.

12. The device of claim 10, wherein the metal power bus overlaps an entirety of the first common source/drain region.

13. The device of claim 10, wherein the first, the second, the third, and the fourth MOS devices are PMOS devices.

14. The device of claim 10, wherein the first, the second, the third, and the fourth MOS devices are NMOS devices.

15. A device comprising:
a plurality of fingers identical to each other, each comprising:
a first Metal-Oxide-Semiconductor (MOS) device comprising:
a first gate, wherein the first gates of the first MOS devices in the plurality of fingers are interconnected;
a first source/drain region, wherein the first source/drain regions of the first MOS devices in the plurality of fingers are interconnected; and
a second source/drain region; and
a second MOS device cascaded with the first MOS device, wherein the first and the second MOS devices have a same conductivity type, and wherein the second MOS device comprises:
a second gate, wherein the second gates of the second MOS devices in the plurality of fingers are interconnected;
a third source/drain region forming a common source/drain region with the second source/drain region, wherein the common source/drain regions in the plurality of fingers are disconnected from each other; and
a fourth source/drain region, wherein the fourth source/drain regions of the second MOS devices in the plurality of fingers are interconnected; and
a power bus coupled to the first source/drain regions of the first MOS devices in the plurality of fingers, wherein the power bus overlaps an entirety of all of the common source/drain regions in the plurality of fingers.

16. The device of claim 15, wherein the first MOS device and the second MOS device are P-type MOS (PMOS) devices.

17. The device of claim 15, wherein the first MOS device and the second MOS device are N-type MOS (NMOS) devices.

18. The device of claim 15, wherein the first and the second MOS devices in the plurality of fingers share a common active region strip that extends underlying the first gate and the second gate.

19. The device of claim 15, wherein no contact plug is overlying and connected to the common source/drain region.

* * * * *